United States Patent
Grinchuk et al.

(10) Patent No.: US 8,797,668 B1
(45) Date of Patent: Aug. 5, 2014

(54) SYSTEMS AND METHODS FOR PENALTY BASED MULTI-VARIANT ENCODING

(71) Applicant: LSI Corporation, San Jose, CA (US)

(72) Inventors: Mikhail I Grinchuk, San Jose, CA (US); Anatoli A. Bolotov, San Jose, CA (US); Shaohua Yang, San Jose, CA (US); Victor Krachkovsky, Allentown, PA (US); Zongwang Li, San Jose, CA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/875,951

(22) Filed: May 2, 2013

Related U.S. Application Data

(60) Provisional application No. 61/780,145, filed on Mar. 13, 2013.

(51) Int. Cl.
*G11B 5/02* (2006.01)
*G11B 5/09* (2006.01)
*H04H 9/00* (2006.01)

(52) U.S. Cl.
USPC ............... 360/55; 360/460; 360/46; 380/277

(58) Field of Classification Search
None
See application file for complete search history.

(56) References Cited

U.S. PATENT DOCUMENTS

| | | | |
|---|---|---|---|
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | Mccalissister | |
| 6,023,783 A | 2/2000 | Divsalar | |
| 6,029,264 A | 2/2000 | Kobayashi | |
| 6,065,149 A | 5/2000 | Yamanaka | |
| 6,097,764 A | 8/2000 | Mccalissister | |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — Regina N Holder
(74) *Attorney, Agent, or Firm* — Hamilton DeSanctis & Cha

(57) ABSTRACT

Systems, methods, devices, circuits for data processing, and more particularly to penalty based multi-variant encoding of data.

20 Claims, 6 Drawing Sheets

(56) References Cited

U.S. PATENT DOCUMENTS

| | | |
|---|---|---|
| 6,351,832 B1 | 2/2002 | Wei |
| 6,377,610 B1 | 4/2002 | Hagenauer |
| 6,381,726 B1 | 4/2002 | Weng |
| 6,473,878 B1 | 10/2002 | Wei |
| 6,535,553 B1 | 3/2003 | Limberg et al. |
| 6,625,775 B1 | 9/2003 | Kim |
| 6,748,034 B2 | 6/2004 | Hattori |
| 6,757,862 B1 | 6/2004 | Marianetti, II |
| 6,785,863 B2 | 8/2004 | Blankenship |
| 6,810,502 B2 | 10/2004 | Eidson |
| 6,970,511 B1 | 11/2005 | Barnette |
| 6,986,098 B2 | 1/2006 | Poeppelman |
| 7,047,474 B2 | 5/2006 | Rhee |
| 7,058,873 B2 | 6/2006 | Song |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,184,486 B1 | 2/2007 | Wu |
| 7,191,378 B2 | 3/2007 | Eroz |
| 7,203,887 B2 | 4/2007 | Eroz |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,646,829 B2 | 1/2010 | Ashley |
| 7,702,986 B2 | 4/2010 | Bjerke |
| 7,752,523 B1 | 7/2010 | Chaichanavong |
| 7,779,325 B2 | 8/2010 | Song |
| 7,802,172 B2 | 9/2010 | Casado |
| 7,952,824 B2 | 5/2011 | Dziak |
| 7,958,425 B2 | 6/2011 | Chugg |
| 7,996,746 B2 | 8/2011 | Livshitz |
| 8,018,360 B2 | 9/2011 | Nayak |
| 8,201,051 B2 | 6/2012 | Tan |
| 8,237,597 B2 | 8/2012 | Liu |
| 8,261,171 B2 | 9/2012 | Annampedu |
| 8,291,284 B2 | 10/2012 | Savin |
| 8,295,001 B2 | 10/2012 | Liu |
| 2008/0069373 A1 | 3/2008 | Jiang |
| 2008/0304558 A1 | 12/2008 | Zhu et al. |
| 2009/0132893 A1 | 5/2009 | Miyazaki |
| 2009/0185643 A1 | 7/2009 | Fitzpatrick |
| 2011/0167227 A1 | 7/2011 | Yang |
| 2011/0255694 A1* | 10/2011 | Miyauchi et al. ............. 380/277 |
| 2011/0264987 A1 | 10/2011 | Li |
| 2012/0124118 A1 | 5/2012 | Ivkovic |
| 2012/0182643 A1 | 7/2012 | Zhang |
| 2012/0207201 A1 | 8/2012 | Xia |
| 2012/0212849 A1 | 8/2012 | Xu |
| 2012/0262814 A1 | 10/2012 | Li |
| 2012/0265488 A1 | 10/2012 | Sun |

OTHER PUBLICATIONS

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fair et al., "Guided scrambling: a new line coding technique for high bit rate fiber optic transmission systems", IEEE Trans. Commun., vol. 39, pp. 289-297 (Feb. 1991).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Jin et al., "Design Techniques for Weakly Constrained Codes", IEEE Trans Commun. vol. 51, No. 5, pp. 709-714 (May 2003).

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF($2^\wedge$ m) LDPC Decoders", IEEE Transactions on Circuits and Systemssi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/174,537, filed Jun. 30, 2011 (Anantha Raman Krishnan), Unpublished.

U.S. Appl. No. 13/284,730, filed Oct. 28, 2011 (Fan Zhang), Unpublished.

U.S. Appl. No. 13/284,767, filed Oct. 28, 2011 (Fan Zhang), Unpublished.

U.S. Appl. No. 13/742,340, filed Jan. 15, 2013 (Razmik Karabed), Unpublished.

U.S. Appl. No. 13/227,544, filed Sep. 8, 2011 (Shaohua Yang), Unpublished.

U.S. Appl. No. 13/186,234, filed Jul. 19, 2011 (Haitao Xia), Unpublished.

U.S. Appl. No. 13/213,751, filed Aug. 19, 2011 (Fan Zhang), Unpublished.

U.S. Appl. No. 13/283,549, filed Oct. 27, 2011 (Wu Chang), Unpublished.

U.S. Appl. No. 13/296,022, filed Nov. 14, 2011 (Victor Krachkovsky), Unpublished.

U.S. Appl. No. 13/180,495, filed Jul. 11, 2011 (Chung-Li Wang), Unpublished.

U.S. Appl. No. 13/174,453, filed Jun. 30, 2011 (Johnson Yen), Unpublished.

(56) References Cited

OTHER PUBLICATIONS

U.S. Appl. No. 13/171,615, filed Jun. 29, 2011 (Bradley D. Seago), Unpublished.
U.S. Appl. No. 13/113,219, filed May 23, 2011 (Yang Han), Unpublished.
U.S. Appl. No. 13/269,832, filed Oct. 10, 2011 (Haitao Xia), Unpublished.
U.S. Appl. No. 13/269,852, filed Oct. 10, 2011 (Haitao Xia), Unpublished.
U.S. Appl. No. 13/227,416, filed Sep. 7, 2011 (Lei Chen), Unpublished.
U.S. Appl. No. 13/989,583, filed Oct. 15, 2012 (Shaohua Yang), Unpublished.
U.S. Appl. No. 13/445,834, filed Apr. 12, 2012 (Chung-Li Wang), Unpublished.
U.S. Appl. No. 13/545,833, filed Jul. 10, 2012 (Zhi Bin Li), Unpublished.
U.S. Appl. No. 13/305,551, filed Nov. 28, 2011 (Yang Han), Unpublished.
U.S. Appl. No. 13/596,947, filed Aug. 28, 2012 (Fan Zhang), Unpublished.
U.S. Appl. No. 13/239,683, filed Sep. 22, 2011 (Changyou Xu), Unpublished.
U.S. Appl. No. 13/596,978, filed Aug. 28, 2012 (Fan Zhang), Unpublished.
U.S. Appl. No. 13/597,001, filed Aug. 28, 2012 (Fan Zhang), Unpublished.
U.S. Appl. No. 13/619,907, filed Sep. 14, 2012 (Fan Zhang), Unpublished.
U.S. Appl. No. 13/363,751, filed Feb. 1, 2012 (Lei Chen), Unpublished.
U.S. Appl. No. 13/597,026, filed Aug. 28, 2012 (Fan Zhang), Unpublished.
U.S. Appl. No. 13/596,819, filed Aug. 28, 2012 (Shaohua Yang), Unpublished.
U.S. Appl. No. 13/622,294, filed Sep. 18, 2012 (Fan Zhang), Unpublished.
U.S. Appl. No. 13/670,393, filed Nov. 6, 2012 (Lei Chen), Unpublished.
U.S. Appl. No. 13/777,841, filed Feb. 26, 2013 (Shu Li), Unpublished.
U.S. Appl. No. 13/777,976, filed Feb. 26, 2013 (Shu Li), Unpublished.
U.S. Appl. No. 13/777,381, filed Feb. 26, 2013 (Shaohua Yang), Unpublished.
U.S. Appl. No. 13/741,003, filed Jan. 14, 2013 (Lu Lu), Unpublished.
U.S. Appl. No. 13/873,224, filed Apr. 30, 2013 (Razmik Karabed), Unpublished.
U.S. Appl. No. 13/742,336, filed Jan. 15, 2013 (Jianzhong Huang), Unpublished.
U.S. Appl. No. 13/621,341, filed Sep. 17, 2012 (Shaohua Yang), Unpublished.
U.S. Appl. No. 13/426,714, filed Mar. 22, 2012 (Shaohua Yang), Unpublished.
U.S. Appl. No. 13/302,119, filed Nov. 22, 2011 (Lei Chen), Unpublished.
U.S. Appl. No. 13/300,078, filed Nov. 18, 2011 (Chung-Li Wang), Unpublished.
U.S. Appl. No. 13/295,150, filed Nov. 14, 2011 (Zongwang Li), Unpublished.
U.S. Appl. No. 13/305,510, filed Nov. 28, 2011 (Lei Chen), Unpublished.
U.S. Appl. No. 13/369,468, filed Feb. 9, 2012 (Zongwang Li), Unpublished.
U.S. Appl. No. 13/340,951, filed Dec. 30, 2011 (Lei Chen), Unpublished.
U.S. Appl. No. 13/340,974, filed Dec. 30, 2011 (Dan Liu), Unpublished.
U.S. Appl. No. 13/327,279, filed Dec. 15, 2011 (Wei Feng), Unpublished.
U.S. Appl. No. 13/316,741, filed Dec. 12, 2011 (Yang Han), Unpublished.
U.S. Appl. No. 13/316,858, filed Dec. 12, 2011 (Zongwang Li), Unpublished.
U.S. Appl. No. 13/362,409, filed Jan. 31, 2012 (Fan Zhang), Unpublished.
U.S. Appl. No. 13/445,848, filed Apr. 12, 2012 (Bruce Wilson), Unpublished.
U.S. Appl. No. 13/412,520, filed Mar. 5, 2012 (Fan Zhang), Unpublished.
U.S. Appl. No. 13/372,580, filed Feb. 14, 2012 (Fan Zhang), Unpublished.
U.S. Appl. No. 13/422,986, filed Mar. 16, 2012 (Fan Zhang), Unpublished.
U.S. Appl. No. 13/433,693, filed Mar. 29, 2012 (Fan Zhang), Unpublished.
U.S. Appl. No. 13/445,878, filed Apr. 12, 2012 (Yu Liao), Unpublished.
U.S. Appl. No. 13/474,660, filed May 17, 2012 (Zongwang Li), Unpublished.
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong, "Block-LDPC: A Practical LDPC Coding System Design Approach", IEEE Trans. on Circuits, Regular Papers, vol. 5, No. 4, pp. 766-775, Apr. 2005.

\* cited by examiner

SYSTEMS AND METHODS FOR PENALTY BASED MULTI-VARIANT ENCODING

CROSS REFERENCE TO RELATED APPLICATIONS

The present application claims priority to (is a non-provisional of) U.S. Pat. App. No. 61/780,145, entitled "Systems and Methods for Penalty Based Multi-Variant Encoding", and filed Mar. 13, 2013 by Grinchuk et al, the entirety of which is incorporated herein by reference for all purposes.

FIELD OF THE INVENTION

Various embodiments of the present invention provide systems and methods for data processing, and more particularly to systems and methods for encoding data in a data processing system.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Data may be encoded to constrain patterns in the data, preventing or replacing error-prone data patterns. Data may also be encoded to enable error correction, for example adding parity bits to the data that allow errors to be detected and corrected downstream. However, parity bits added after constraint encoding are not protected by the constraint encoding and can therefore be more likely to have errors.

SUMMARY

Various embodiments of the present invention provide systems and methods for data processing, and more particularly to systems and methods for encoding data in a data processing system.

A data processing system is disclosed including a salting circuit operable to apply a plurality of salt data patterns to data derived from a data input, at least one encoding circuit operable to encode the data derived from the data input to yield a number of candidate codewords, wherein each of the candidate codewords is at least partially different due to the plurality of salt data patterns applied by the salting circuit, and a codeword selection circuit operable to select one of the candidate codewords as an output codeword based at least in part on robustness data for patterns in the candidate codewords.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. This summary provides only a general outline of some embodiments of the invention. Additional embodiments are disclosed in the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components.

DETAILED DESCRIPTION OF THE INVENTION

Figure 1:
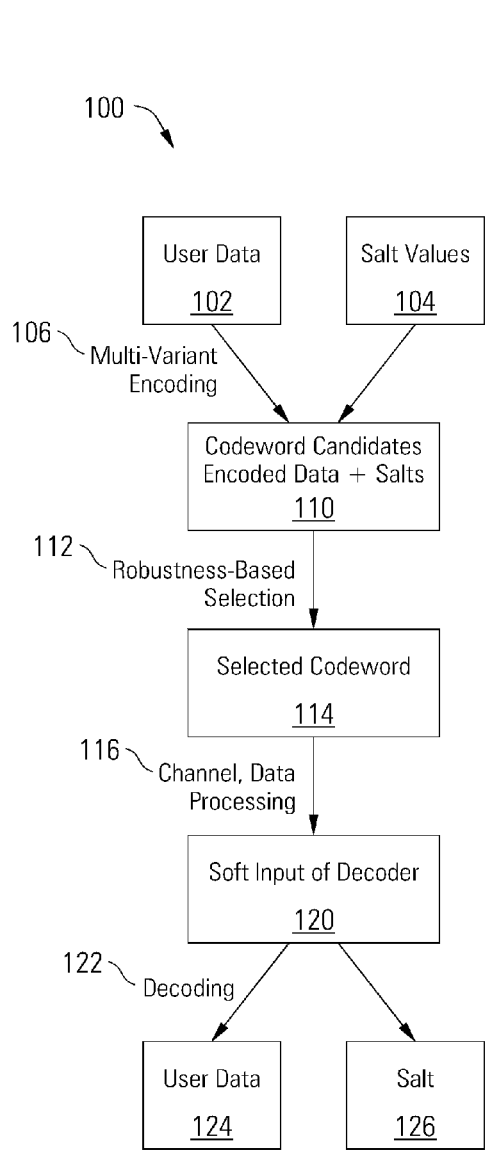
FIG. 1 is a data flow diagram in a data processing system including a penalty based multi-variant encoder in accordance with one or more embodiments of the present invention.

Various embodiments of the present invention provide data processing systems with a penalty based multi-variant (or multi-mode) encoder, which encodes input data multiple times with different salt values added, yielding a number of candidate codewords. The salt values are relatively short data patterns that are added to input data, causing their corresponding encoded output data or candidate codewords to differ even though the original input data to each is the same and the encoding algorithm applied to each is the same. The salt values may be, but are not limited to, four-bit data patterns that make available 16 different salt possibilities and therefore 16 possible candidate codewords. Each of the candidate codewords, when decoded, would yield the input data, along with their associated salt value that can be discarded. The candidate codewords are analyzed to select a codeword that avoids patterns that are likely to result in errors during storage or transmission. The candidate codewords are analyzed in some embodiments using robustness or quality data that is generated in advance.

In some embodiments, input data is encoded in a modulation encoder such as run length limiting (RLL) or maximum transition run (MTR) encoder, preventing patterns in the resulting modulation encoded data that are likely to result in errors after storage or transmission. Such a modulation encoder might, for example, limit the number of consecutive data values without a transition in the data to be written, or might limit the number of consecutive transitions in the data to be written, which might be likely to cause errors when stored on a magnetic hard disk drive. The modulation encoded data is then encoded in a low density parity check encoder which generates parity bits to be inserted into the modulation encoded data. In such embodiments, the parity bits do not receive the modulation encoding and are therefore subject to a higher error rate than the modulation encoded data. The penalty based multi-variant encoding mitigates the higher error rate for the parity portion of encoded data which might not otherwise be protected by modulation encoding.

Some embodiments of the penalty based multi-variant encoder include multiple encoders to encode the input data with various salt values in parallel, such as but not limited to 16 parallel low density parity check code encoders each encoding input data along with a different four-bit salt value. Typically, the low density parity check encoder is a very small fraction of the overall data processing circuit, and multiplying the number of encoders to provide the multi-variant encoder substantially reduces the likelihood of errors with a relatively small increase in the size of the circuit. In other embodiments, the penalty based multi-variant encoder generates candidate codewords using at least some sequential encoding of differently salted input values, where sequential encoding does not introduce an unacceptable increase in latency.

The robustness or quality data used to select between the candidate codewords is generated in some embodiments by passing known data through an actual data processing system and channel, whether physical or simulation, that will be used to process data, and by determining which patterns in the known data are most likely to result in errors. Errors are analyzed on the detector output side (or read side) of the data processing system, and the resulting data is used to select among candidate codewords on the write channel side when performing multi-variant encoding. The penalty function used to generate the robustness data is thus operable to reduce errors after a data detector on the read channel side of the data processing system.

Penalty based multi-variant encoding provides a number of benefits in data processing systems. The multi-variant encoding adds protection for low density parity check code parity bits which are generally not otherwise protected by modulation encoding or pattern constraint encoding. Multi-variant encoding can be constrained more flexibly than just limiting the maximum run length or number of consecutive transitions. Candidate codewords can be distinguished and selected on the basis of reducing the bit error rate (for binary low density parity check systems) or symbol error rate (for non-binary low density parity check systems) after data detection in the read channel, or reducing the frame error rate after data decoding in the read channel, or by a combination of the two or by other error measurements. In other words, data patterns can be penalized proportionally to the probabilities of incurred errors using any suitable error measurement technique. The cost/penalty function is based not on predetermined universal constraints, but on the analysis of the write channel for particular channel conditions for the most common errors.

Turning to FIG. 1, data flow is depicted in a data processing system including a penalty based multi-variant encoder in accordance with one or more embodiments of the present invention. User data 102 is combined with salt values 104 to produce a number of different combined data patterns to be encoded in a multi-variant encoding process 106. The user data 102 is modulation encoded in some embodiments. In other embodiments, the user data 102 is data that is provided for storage or transmission and has not been modulation encoded. The multi-variant encoding process 106 yields a number of codeword candidates 110, encoded versions of the user data 102 combined with different salt values 104. Notably, each of the codeword candidates 110 are valid encoded versions of the user data 102, although they are encoded in different data patterns because of the effect the different salt values 104 cause in the multi-variant encoding process 106. Thus, any of the codeword candidates 110 can be stored or transmitted, then processed and decoded in the identical manner with the same decoding process to result in a decoded version of the user data 102. The multi-variant encoding process 106 is not limited to any particular encoding technique, and the codeword candidates 110 therefore can be based on the user data 102 and salt values 104 in a number of different manners in various embodiments of the present invention.

The codeword candidates 110 are analyzed in a robustness-based selection process 112 to identify a selected codeword 114, one of the codeword candidates 110 that has a lower likelihood of developing errors as the selected codeword 114 is stored or transmitted and then processed in a data detection and/or data decoding operation. The selected codeword 114 is passed through a data channel 116 including storage and/or transmission and data processing. In some embodiments, data derived from the selected codeword 114 after passing through the data channel 116 is provided at the soft input of a decoder 120, which is operable to apply a decoding process 122 to reverse the encoding applied by the multi-variant encoding 106. The decoding process 122 yields the user data 124 corresponding to the user data 102 at the input to the data processing system. The decoding process 122 also yields the salt value 126 added to the user data 102 to form the selected codeword 114, which can be stripped from the user data 124 and discarded.

Figure 2:
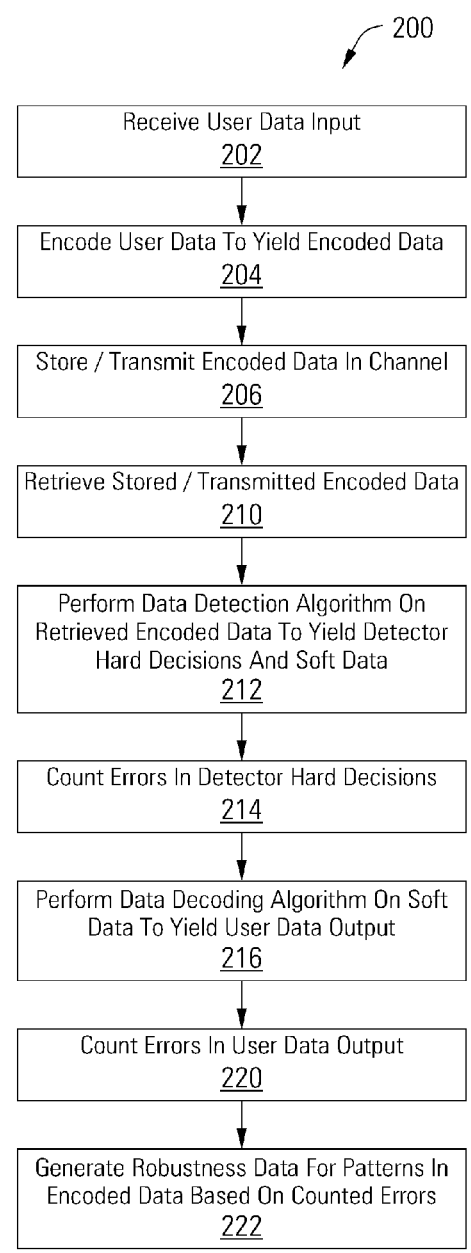
FIG. 2 is a flow diagram showing a method for generating robustness data to be used in a multi-variant encoder in accordance with one or more embodiments of the present invention.

Turning to FIG. 2, a flow diagram 200 shows a method for generating robustness data to be used in a multi-variant encoder in accordance with one or more embodiments of the present invention. Following flow diagram 200, a user data input is received (block 202). The user data is known test data in some embodiments, allowing the output data at the end of the data processing system to be compared with the input user data to identify the errors and determine the robustness or quality of various data patterns in the input user data as it passes through the channel and data processing system. The user data is encoded to yield encoded data (block 204). The encoding is performed in the same manner during this training process to generate robustness data as it will be performed in the multi-variant encoder during operation. The resulting encoded data is stored and/or transmitted in a data channel (block 206), such as but not limited to storing the encoded data on a magnetic hard disk or transmitting the encoded data wirelessly over a transmission medium. The stored or transmitted encoded data is received (block 210), and a data detection algorithm is performed on the retrieved encoded data to yield detector hard decisions and soft data (block 212). In some embodiments, the data detection algorithm may be but is not limited to, a Viterbi algorithm detection algorithm or a maximum a posteriori detection algorithm as are known in the art. Based upon the disclosure provided herein, one of ordinary skill in the art will recognize a variety of data detection algorithms that may be used in relation to different embodiments of the present invention. Data detector circuit 358 may provide both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

The bit or symbol errors in the detector hard decisions are counted in some embodiments to generate the likelihood of error in different data patterns in the encoded data (block 214). A data decoding algorithm is performed in some embodiments on the soft decisions from the data detector to yield user data output (block 216). The data decoding algorithm is applied in a data decoder circuit in an attempt to recover originally written data. The data decoder circuit may be any data decoder circuit known in the art that is capable of applying a decoding algorithm to a received input. Data decoder circuit may be, but is not limited to, a low density parity check decoder circuit or a Reed Solomon decoder circuit as are known in the art. Based upon the disclosure provided herein, one of ordinary skill in the art will recognize a variety of data decoder circuits that may be used in relation to different embodiments of the present invention. Errors such as frame errors in the user data output (e.g., hard decisions) from the data decoding algorithm are counted (block 220).

Robustness data is generated for patterns in the encoded data based on the counted errors (block 222), using either or both the bit/symbol or frame errors counted in blocks 214 and 220. Robustness data can be made available to a multi-variant encoder in any suitable manner, such as but not limited to hard coding the robustness data in the encoder, or storing it in any type of memory circuit as a lookup table, etc. In some embodiments, robustness data is calculated for data patterns that consist of triples or triplets, a set of three bits or symbols, where the robustness or quality value for the triple indicates the likelihood of error in the middle of the three bits or symbols when it is preceded and followed by the leading and trailing bits or symbols of the triple, when that triple passes through the channel and is processed by the data processing system. For example, if different bits or symbols are represented by letters, a data stream consisting of symbols "ABCAD" includes triples "ABC", "BCA" and "CAD" as each symbol is shifted through the system. An error would be counted for triple "ABC" when symbol "B" is erroneous when preceded by symbol "A" and followed by symbol "C" as it passes through the system. Similarly, an error would be counted for triple "BCA" when symbol "C" is erroneous when preceded by symbol "B" and followed by symbol "A" as it passes through the system. In other embodiments, encoded data is divided into data patterns in other manners and error rates for each of the data patterns are determined and quantified in other manners. Based upon the disclosure provided herein, one of ordinary skill in the art will recognize a variety of data pattern divisions and error quantization algorithms that may be used in relation to different embodiments of the present invention.

The test data is run through the data processing system using the process of FIG. 2 until each possible triple has occurred a particular number N of times, such as but not limited to 1000 occurrences, while counting the errors that result for each triple during its N occurrences. The error count for each triple is maintained using a counter for each possible triple, representing the count of errors in the middle bit or symbol of the triple when it appears in the triple, preceded and followed by the first and last bits or symbols of that triple. In other words, a counter is maintained for errors in symbol A when preceded by B and followed by C, another counter is maintained for errors in symbol A when preceded by D and followed by B, etc.

The number of errors for each triple is then divided by N to yield the likelihood of error for each triple. Robustness data is shown in the graph 300 of FIG. 3, with the data patterns along the X axis and the error rate along the Y axis. In this example, each triple is made up of three two-bit symbols written vertically at the bottom of graph 300, where "00" is denoted as A, "01" is B, "10" is C, and "11" is D. For example, triple 302, "000000" or AAA has a first symbol with a value of "00", a second symbol with a value of "00" and a third symbol of "00", where the error rate 304 is $1/10^3$ or 0.001. In other words, when triple AAA passes through the system, the likelihood of error in the middle symbol A is 1 in 1000. Triple 306 or "010101" or "BBB" has a higher error rate 310 or just under $1/10^1$. In other words, when triple "BBB" passes through the system, the likelihood of error in the middle symbol B is just under 100 in 1000, or just under 10 percent. In other words, there is a relatively high probability when reading pattern "BBB" that there will be an error in the middle symbol "B", perhaps because it results in a magnetic pattern on a disk that is unstable or is undetectable, or for any of a number of other reasons. Triple 306 or "BBB" is therefore a triple to be avoided because of the relatively high error rate, and if some of the candidate codewords contained triple 306 or "BBB" and another did not, the candidate codeword without triple 306 or "BBB" would likely be a better selection for the codeword to store or transmit, depending on the error rates of the other triples in the candidate codeword.

The robustness data is not particularly dependent on the signal to noise ratio (SNR) of the channel during operation. Thus, the robustness data can be used to select from among the candidate codewords to yield a codeword that will reduce errors, relatively independent of the operation conditions once the training process is performed based on the expected channel and the design of the data processing system.

The candidate codewords are evaluated and characterized after encoding based on the robustness data. Each candidate codeword, or the parts of each candidate codeword that differ due to the inclusion of the salt values, is examined to determine how likely it will be to incur errors. In embodiments in which the salt values are added after modulation encoding and before low density parity check encoding, only the parity bits generated by low density parity check encoding will differ due to salting, and only the parity bits in these embodiments are evaluated based on robustness data.

Figure 3:
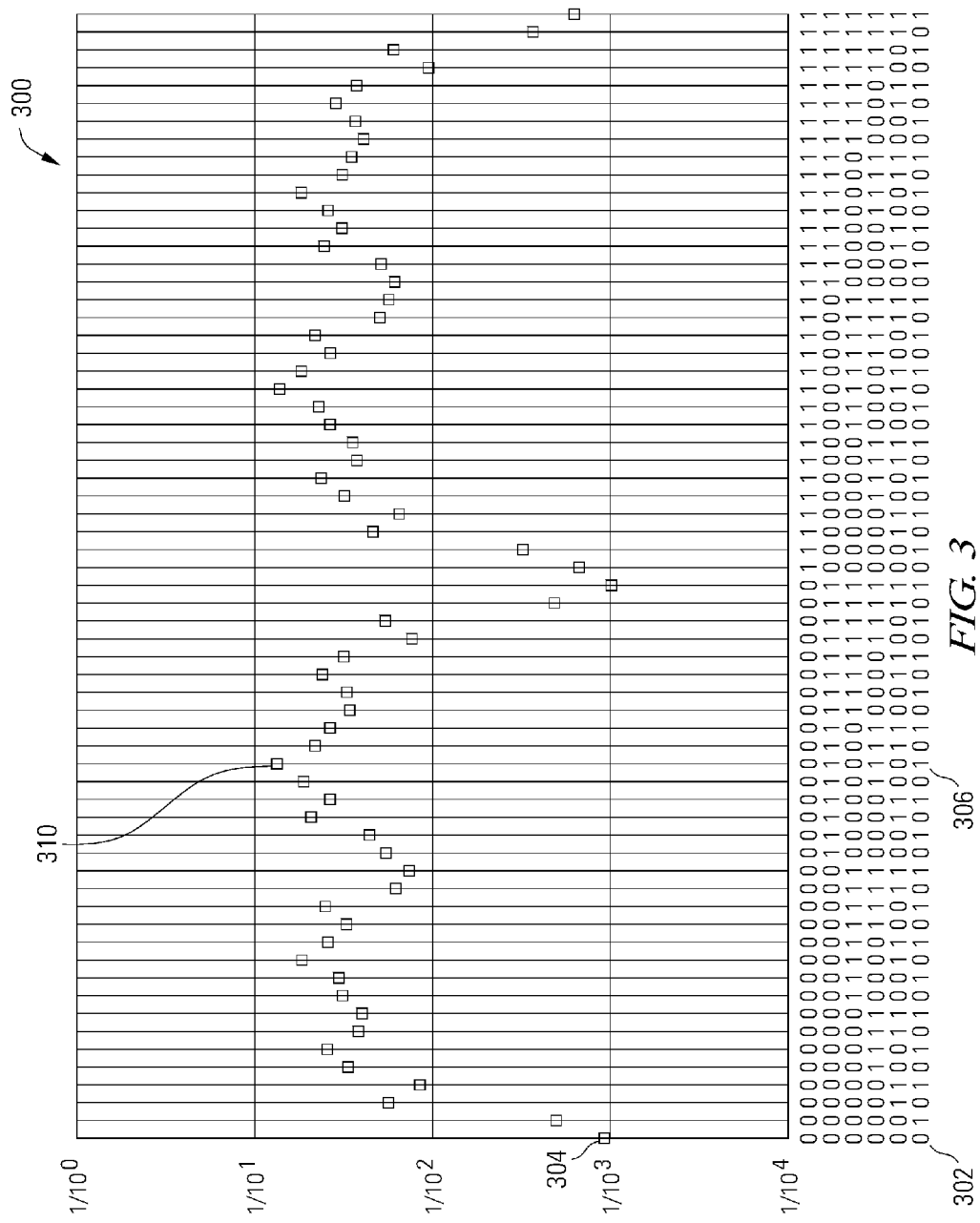
FIG. 3 is a graph of robustness data showing the likelihood or rate of errors for symbol triplets in a data processing system in accordance with one or more embodiments of the present invention.

In some embodiments, each candidate codeword or parity bit portion of the candidate codewords is evaluated by passing a sliding window over the data to identify each triple in the data, the penalty value for that triple is retrieved from a lookup table based on the robustness data and accumulated, yielding a robustness or quality value for each of the candidate codewords. The penalty values in the lookup table may be the error rate values as shown in FIG. 3 or may be values derived from those error rate values. The candidate codeword that has the best quality value is selected as the codeword to store or transmit. In some embodiments, this will be the candidate codeword with the lowest accumulated robustness value, or one of the candidate codewords with the lowest accumulated robustness value if multiple candidate codewords share the lowest accumulated robustness value. In other embodiments, other criteria may be included in the selection decision along with the accumulated robustness values.

Figure 4:
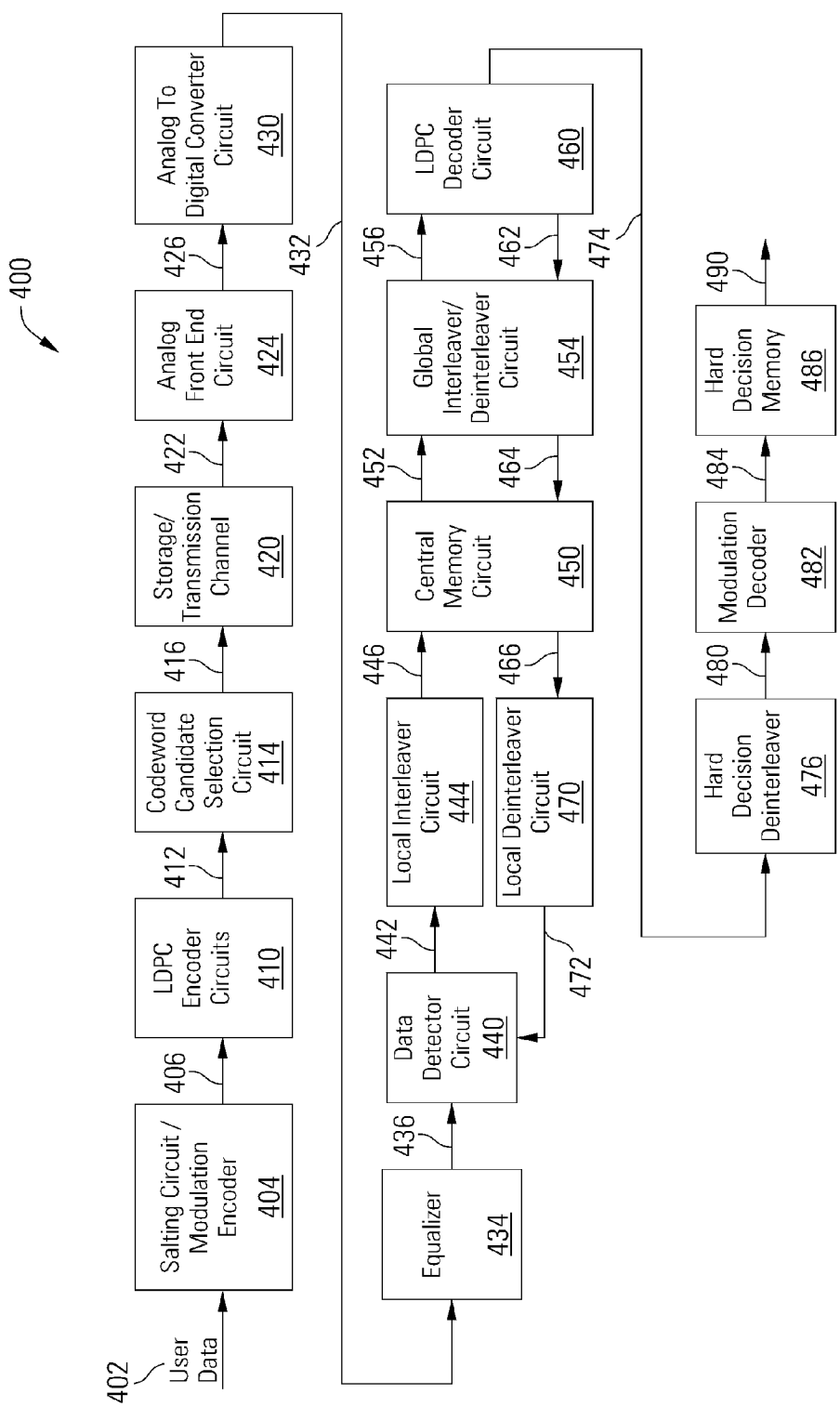
FIG. 4 depicts a data processing system with penalty based multi-variant encoding in accordance with one or more embodiments of the present invention.

Turning to FIG. 4, a data processing system 400 with penalty based multi-variant encoding is disclosed in accordance with one or more embodiments of the present invention. The data processing system 400 is operable to process user data 402, store or transmit them through a storage or transmission channel 420 and retrieve the decoded user data 490 without introducing errors.

The user data 402 is processed by a salting circuit and modulation encoder 404 which adds salt values to user data 402, either before or after modulation encoding, and which performs modulation encoding to constrain the modulation encoded data to prevent unwanted patterns which are likely to result in errors in the channel. The modulation encoding may be, but is not limited to, run length limiting (RLL) or maximum transition run (MTR) encoding, preventing patterns in the resulting modulation encoded data that are likely to result in errors after storage or transmission. Such a modulation encoder might, for example, limit the number of consecutive data values without a transition in the data to be written, or might limit the number of consecutive transitions in the data to be written, which might be likely to cause errors when stored on a magnetic hard disk drive. A maximum transition run encoder is an enumerative encoder that supports the Maximum Transition Run constraint. The frequency response of the data processing system 400 is generally at a maximum at DC and degrades near the Nyquist frequency, particularly when the storage or transmission channel 420 is a magnetic storage device. By limiting the maximum transition run length in the modulation encoded data, the data processing system 400 operates below the Nyquist frequency and avoids errors that might be introduced by the degraded frequency response near the Nyquist frequency. In some embodiments, the salting circuit and modulation encoder 404 also replaces long zero run patterns in the modulation encoded data that would cause degraded behavior of control loops at the decoder side.

The salting circuit and modulation encoder 404 yields a number of salted data outputs 406. The salt values applied by the salting circuit and modulation encoder 404 may have any length and placement relative to the user data 402, such as, but not limited to, 4 bits prepended to the user data 402 providing 16 possible variants in the salted data outputs 406. Based upon the disclosure provided herein, one of ordinary skill in the art will recognize a variety of modulation encoding circuits and salting circuits that may be used in relation to different embodiments of the present invention.

The salted data outputs 406 are processed by one or more low density parity check encoder circuits 410, encoding the salted data outputs 406 in parallel or sequentially or in a combination of the two. The low density parity check encoder circuits 410 generate parity bits for the salted data outputs 406 and combine the parity bits with the salted data outputs 406 to yield a number of candidate codewords 412. Each of the candidate codewords 412 is a valid encoded version of the user data 402 and may be decoded using the same decoding algorithm, although each has a different data pattern due to the salting. Again, because parity bits are not covered by the modulation encoding in salting circuit and modulation encoder 404, they have a relatively poor signal to noise ratio when compared with the constrained modulation encoded data.

A candidate codeword selection circuit 414 analyzes each of the candidate codewords 412 according to robustness data generated previously for the data processing system 400, selecting one of the candidate codewords 412 that is relatively unlikely to result in errors, and yielding a codeword 416 for storage or transmission in storage or transmission channel 420. Each candidate codeword 412 or parity bit portion of the candidate codeword 412 is evaluated by passing a sliding window over the data to identify each triple in the data and accumulating the penalty value for that triple from a lookup table to yield a robustness or quality value for the candidate codewords 412. The candidate codeword that has the best quality value is selected as the codeword to store or transmit. In some embodiments, this will be the candidate codeword with the lowest accumulated robustness value, or one of the candidate codewords with the lowest accumulated robustness value if multiple candidate codewords share the lowest accumulated robustness value. By selecting from among the candidate codewords 412 produced by the multi-variant encoding performed in low density parity check encoder circuits 410, a codeword 416 that is relatively unlikely to sustain errors is stored or transmitted in storage or transmission channel 420.

An analog signal 422 based on the codeword 416 is retrieved from storage or transmission channel 420 and is processed in an analog front end circuit 424. Analog front end circuit 424 processes analog signal 422 and provides a processed analog signal 426 to an analog to digital converter circuit 430. Analog front end circuit 430 may include, but is not limited to, an analog filter and an amplifier circuit as are known in the art. Based upon the disclosure provided herein, one of ordinary skill in the art will recognize a variety of circuitry that may be included as part of analog front end circuit 430. In some embodiments, analog signal 422 is derived from a read/write head assembly (not shown) that is disposed in relation to a storage medium (e.g., 420). In other embodiments, analog signal 422 is derived from a receiver circuit (not shown) that is operable to receive a signal from a transmission medium (e.g., 420). The transmission medium may be wired or wireless. Based upon the disclosure provided herein, one of ordinary skill in the art will recognize a variety of source from which analog signal 422 may be derived.

Analog to digital converter circuit 430 converts the processed analog signal 426 into a corresponding series of digital samples. Analog to digital converter circuit 430 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. The digital samples are provided to an equalizer circuit 434. Equalizer circuit 434 applies an equalization algorithm to the digital samples to yield an equalized output 436. In some embodiments of the present invention, equalizer circuit 434 is a digital finite impulse response filter circuit as are known in the art. In some cases, equalizer circuit 434 includes sufficient memory to maintain one or more codewords until a data detector circuit 440 is available for processing, and for multiple passes through data detector circuit 440.

Data detector circuit 440 is operable to apply a data detection algorithm to a received codeword or data set, and in some cases data detector circuit 440 can process two or more codewords in parallel. In some embodiments of the present invention, data detector circuit 440 is a Viterbi algorithm data detector circuit as are known in the art. In other embodiments of the present invention, data detector circuit 440 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 440 is started based upon availability of a data set from equalizer circuit 434 or from a central memory circuit 450.

Upon completion, data detector circuit 440 provides a detected output 442 which includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 442 is provided to a local interleaver circuit 444. Local interleaver circuit 444 is operable to shuffle sub-portions (i.e., local chunks) of the data set included as detected output 442 and provides an interleaved codeword 446 that is stored to central memory circuit 450. Local interleaver circuit 444 may be any circuit known in the art that is capable of shuffling data sets to yield a re-arranged data set.

Once a data decoding circuit 460 is available, a previously stored interleaved codeword 452 is accessed from central memory circuit 450 and globally interleaved by a global interleaver/deinterleaver circuit 454. Global interleaver/deinterleaver circuit 454 may be any circuit known in the art that is capable of globally rearranging codewords. Global interleaver/deinterleaver circuit 454 provides a decoder input 456 to data decoding circuit 460. The interleaving performed by local interleaver circuit 444 and global interleaver/deinterleaver circuit 454 act to spread any localized errors such as burst errors in the detected output 442 across the decoder input 456 so that the data decoding circuit 460 is better able to detect and correct them.

The data decoding circuit 460 used in various embodiments may be any type of low density parity check decoder, including binary and non-binary, layered and non-layered. In some embodiments, the data decoding circuit 460 is a non-binary min-sum based low density parity check decoder. Based upon the disclosure provided herein, one of ordinary skill in the art will recognize other decode algorithms that may be used in relation to different embodiments of the present invention. The data decoding circuit 460 applies a data decode algorithm to decoder input 456 in a variable number of local iterations.

Where the data decoding circuit 460 fails to converge (i.e., fails to yield the originally written data set) and a number of local iterations through data decoding circuit 460 exceeds a threshold, soft decoder output 462 from data decoding circuit 460 is transferred back to central memory circuit 450 via global interleaver/deinterleaver circuit 454. Prior to storage of the soft decoder output 462 to central memory circuit 450, the soft decoder output 462 is globally deinterleaved to yield a globally deinterleaved output 464 that is stored to central memory circuit 450. The global deinterleaving reverses the global interleaving earlier applied to the interleaved codeword 452 to yield the decoder input 456. Once data detector circuit 440 is available, a previously stored deinterleaved output 466 is accessed from central memory circuit 450 and locally deinterleaved by a local deinterleaver circuit 470. Local deinterleaver circuit 470 rearranges the globally deinterleaved output 466 to reverse the shuffling originally performed by local interleaver circuit 444. A resulting deinterleaved output 472 is provided to data detector circuit 440 where it is used to guide subsequent detection of a corresponding data set received as equalized output 436 from equalizer circuit 434.

Alternatively, where the decoded output converges (i.e., yields the originally written data set) in the data decoding circuit 460, the resulting decoded output is provided as an output codeword to a hard decision deinterleaver circuit 476. Hard decision deinterleaver circuit 476 rearranges the data to reverse both the global and local interleaving applied to the data to yield a deinterleaved output 480. Notably, the deinterleaved output 480 includes the salt values added by salting circuit and modulation encoder 404, which can be discarded. Deinterleaved output 480 is provided to a modulation decoder 482 which reverses the modulation encoding performed by salting circuit and modulation encoder 404, yielding hard decisions 484 to be stored in hard decision memory 486 and then provided as a hard decision output 490. Where the detection and decoding process operates correctly, decoded user data 490 is a duplicate of user data 402.

Figure 5:
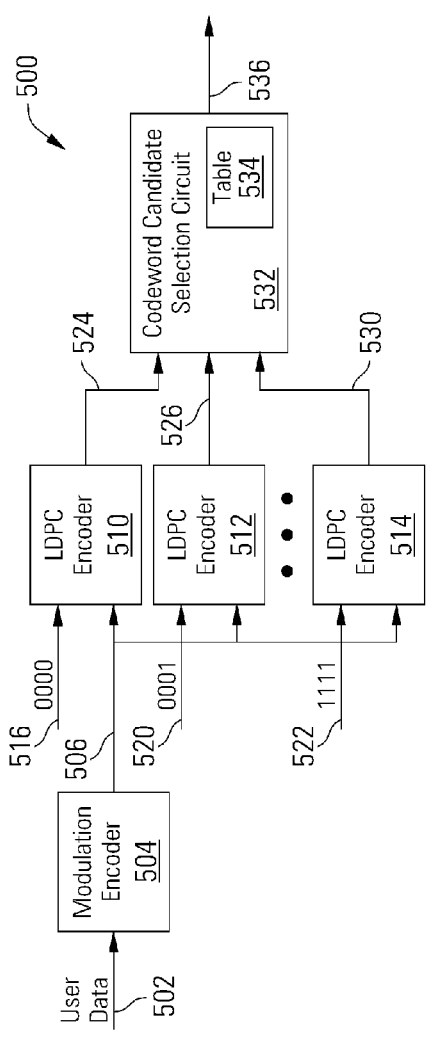
FIG. 5 depicts a penalty based multi-variant encoder in which data is salted after modulation encoding in accordance with one or more embodiments of the present invention.

Turning to FIG. 5, a penalty based multi-variant encoder 500 is depicted in which data is salted after modulation encoding in accordance with one or more embodiments of the present invention. User data 502 is provided to modulation encoder 504 which encodes user data 502 according to pattern constraints such as, but not limited to, run length limiting (RLL) or maximum transition run (MTR) constraints. Based upon the disclosure provided herein, one of ordinary skill in the art will recognize a variety of modulation encoder circuits that may be used in relation to different embodiments of the present invention. The modulation encoder 504 yields modulation encoded data 506, which is provided to a number of low density parity check encoders 510, 512, 514 in parallel. In other embodiments, the encoding is performed at least partially sequentially, sharing encoder circuits. A different salt value 516, 520, 522 is provided to each of the low density parity check encoders 510, 512, 514. The salt values 516, 520, 522 are not limited to the 4-bit values of FIG. 5, and may be combined with the modulation encoded data 506 in any manner prior to encoding in the low density parity check encoders 510, 512, 514, such as prepending the salt values, appending them, or inserting them into the modulation encoded data 506 in any manner. The low density parity check encoders 510, 512, 514 calculate parity bits for the salted modulation encoded data 506 and combine the modulation encoded data 506 with the parity bits, forming a number of codeword candidates 524, 526, 530. Notably, each of the codeword candidates 524, 526, 530 are valid encoded versions of the modulation encoded data 506, although they are encoded in different data patterns because of the effect the different salt values 516, 520, 522 cause in the multi-variant encoding process applied using low density parity check encoders 510, 512, 514. Thus, any of the codeword candidates 524, 526, 530 can be stored or transmitted, then processed and decoded in the identical manner with the same decoding process to result in a decoded version of the user data 502.

A codeword candidate selection circuit 532 analyzes each of the codeword candidates 524, 526, 530 using robustness data stored in a lookup table 534 or made available in any other suitable manner. Each of the codeword candidates 524, 526, 530 is evaluated by passing a sliding window over the data to identify each triple in the data and accumulating the penalty value for that triple from a lookup table 534 to yield a robustness or quality value for the codeword candidates 524, 526, 530. The codeword candidate 524, 526, 530 that has the best quality value is selected as the codeword 536 to store or transmit. In some embodiments, this will be the candidate codeword with the lowest accumulated robustness value, or one of the candidate codewords with the lowest accumulated robustness value if multiple candidate codewords share the lowest accumulated robustness value.

In the embodiment of FIG. 5, only the parity portion of codeword candidates 524, 526, 530 differs, and the modulation encoded data 506 in each of the codeword candidates 524, 526, 530 is the same. The codeword candidate selection circuit 532 therefore only analyzes the parity portion codeword candidates 524, 526, 530 to select codeword 536.

Figure 6:
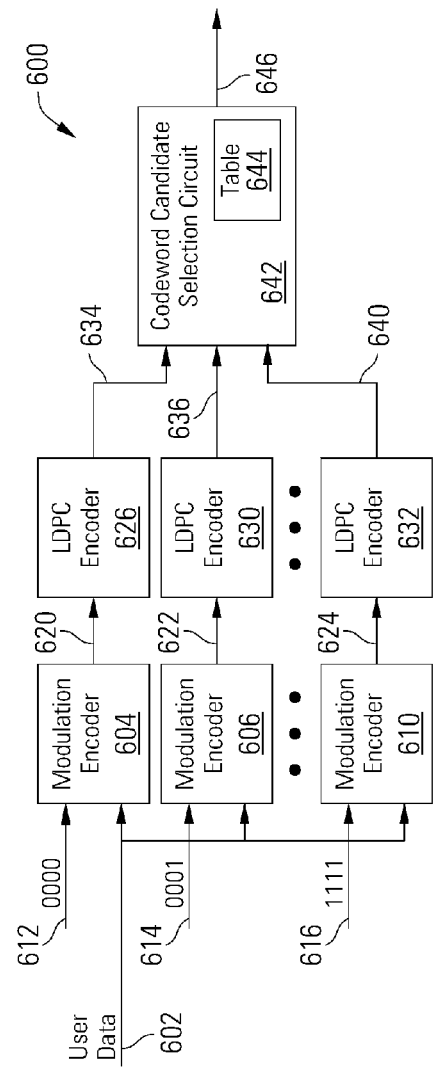
FIG. 6 depicts a penalty based multi-variant encoder in which data is salted before modulation encoding in accordance with one or more embodiments of the present invention.

Turning to FIG. 6, another embodiment of a penalty based multi-variant encoder 600 is disclosed in which data is salted before modulation encoding in accordance with one or more embodiments of the present invention. In this embodiment, robustness is improved due to the fact that variation in the codeword candidates is higher as all bits are varying, but the entire length of each codeword candidate is analyzed to select the output codeword, which can increase latency.

User data 602 is provided to modulation encoders 604, 606, 610 which each encode user data 602 the same way according to pattern constraints such as, but not limited to, run length limiting (RLL) or maximum transition run (MTR) constraints. Based upon the disclosure provided herein, one of ordinary skill in the art will recognize a variety of modulation encoder circuits that may be used in relation to different embodiments of the present invention. A different salt value 612, 614, 616 is provided to each of the modulation encoders 604, 606, 610. The salt values 612, 614, 616 are not limited to the 4-bit values of FIG. 6, and may be combined with the user data 602 in any manner prior to encoding in the modulation encoders 604, 606, 610, such as prepending the salt values, appending them, or inserting them into the user data 602 in any manner.

The modulation encoders 604, 606, 610 yield modulation encoded data variants 620, 622, 624 which are provided to a number of low density parity check encoders 626, 630, 632 in parallel. As with other embodiments, modulation encoding and low density parity check encoding can be performed in parallel, sequentially or in a combination of the two, balancing circuit size against latency. The low density parity check encoders 626, 630, 632 calculate parity bits for the modulation encoded data variants 620, 622, 624 and combine the modulation encoded data variants 620, 622, 624 with their corresponding parity bits, forming a number of codeword candidates 634, 636, 640. Notably, each of the codeword candidates 634, 636, 640 are valid encoded versions of the user data 602, although they are encoded in different data patterns because of the effect the different salt values 612, 614, 616 cause in the multi-variant encoding process applied using modulation encoders 604, 606, 610 and low density parity check encoders 626, 630, 632. Thus, any of the codeword candidates 634, 636, 640 can be stored or transmitted, then processed and decoded in the identical manner with the same decoding process to result in a decoded version of the user data 602.

A codeword candidate selection circuit 642 analyzes each of the codeword candidates 634, 636, 640 using robustness data stored in a lookup table 644 or made available in any other suitable manner. Each of the codeword candidates 634, 636, 640 is evaluated by passing a sliding window over the data to identify each triple in the data and accumulating the penalty value for that triple from the lookup table 644 to yield a robustness or quality value for the codeword candidates 634, 636, 640. The codeword candidate 634, 636, 640 that has the best quality value is selected as the codeword 646 to store or transmit. In some embodiments, this will be the candidate codeword with the lowest accumulated robustness value, or one of the candidate codewords with the lowest accumulated robustness value if multiple candidate codewords share the lowest accumulated robustness value.

Figure 7A:
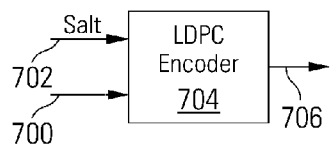
FIG. 7A depicts a low density parity check (LDPC) encoder with a salt input in accordance with one or more embodiments of the present invention.
Figure 7B:
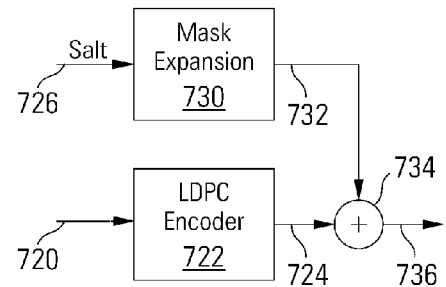
FIG. 7B depicts a low density parity check encoder with salt application by mask expansion in accordance with one or more embodiments of the present invention.

Turning to FIGS. 7A and 7B, in some embodiments in which the salt values are added to modulation encoded data prior to low density parity check encoding, a single low density parity check encoder may be used in some embodiments by applying the salt values to the codeword from the low density parity check encoder using mask expansion. As disclosed in FIG. 7A, in some embodiments a low density parity check encoder 704 is provided for every different salt value 702, combining the salt value 702 with the encoder input 700 prior to encoding, yielding a salted codeword output 706. As disclosed in FIG. 7B, in an embodiment using mask expansion, a single low density parity check encoder 722 is provided for the multi-variant encoding system, with the low density parity check encoder 722 encoding the decoder input 720 to yield an unsalted codeword 724. Each different salt value (e.g., 726) is provided to a mask expansion circuit 730, yielding a different mask (e.g., 732) for each salt value (e.g., 726) that can be combined with the unsalted codeword 724, for example using a summation circuit 734 or XOR circuit. The mask expansion circuit 730 is adapted to identify the bit positions in unsalted codeword 724 that are changed based on the input salt value (e.g., 726), making the changes in summation circuit 734 rather than salting and encoding multiple decoding input variants. Based upon the disclosure provided herein, one of ordinary skill in the art will recognize a variety of mask expansion circuits that may be used in relation to different embodiments of the present invention.

Figure 8:
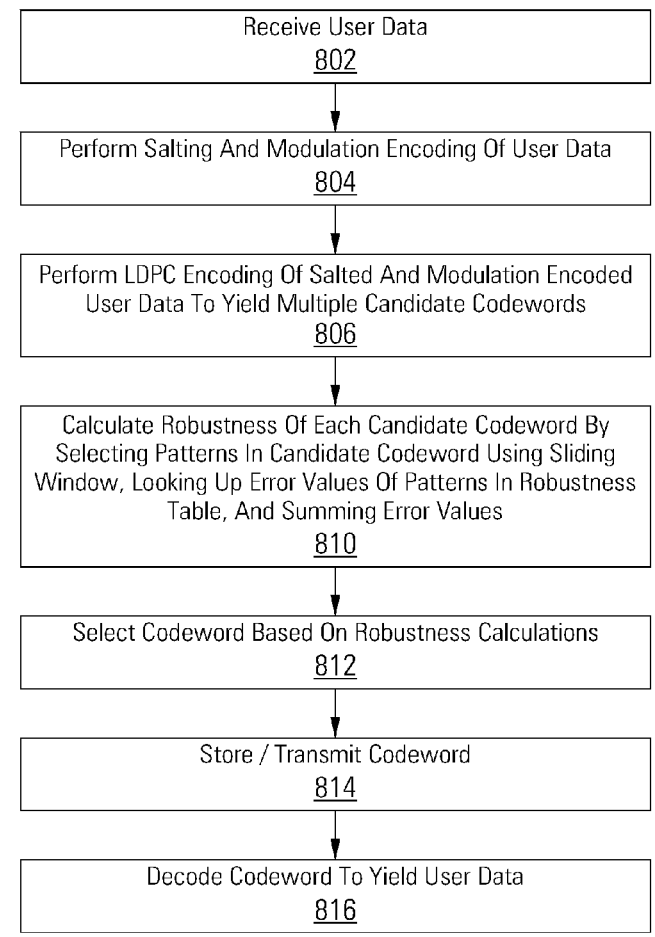
FIG. 8 is a flow diagram showing a method for processing data including penalty based multi-variant encoding in accordance with one or more embodiments of the present invention.

Turning to FIG. 8, flow diagram 800 discloses a method for processing data including penalty based multi-variant encoding in accordance with one or more embodiments of the present invention. Following flow diagram 800, user data is received (block 802) and is salted and modulation encoded (block 804). Again, the salting is performed before modulation encoding in some embodiments, and after modulation encoding in other embodiments. A low density parity check encoding algorithm is applied to the salted and modulation encoded user data to yield multiple candidate codewords (block 806). Notably, each of the candidate codewords are valid encoded versions of the user data, although they are encoded in different data patterns because of the effect the different salt values cause in the multi-variant encoding process. Thus, any of the candidate codewords can be stored or transmitted, then processed and decoded in the identical manner with the same decoding process to result in a decoded version of the user data. The robustness of each candidate codeword is calculated by selecting patterns in the candidate codewords using a sliding window, looking up the error values of the patterns in a robustness data lookup table, and summing the error values (block 810). A codeword is selected based on the robustness calculations (block 812). The codeword is stored or transmitted (block 814), and the codeword is decoded to yield the user data (block 816). As the codeword is decoded, the salt value applied to the codeword will also be yielded, and can be stripped from the user data and discarded.

Figure 9:
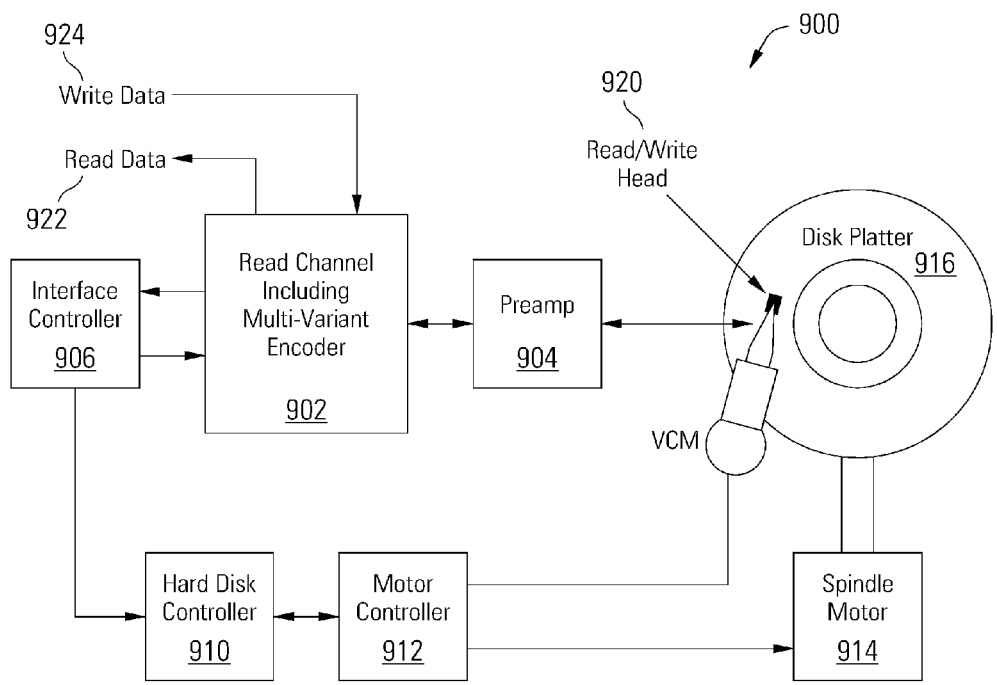
FIG. 9 depicts a storage system including a data processing system with penalty based multi-variant encoding in accordance with one or more embodiments of the present invention.
Figure 10:
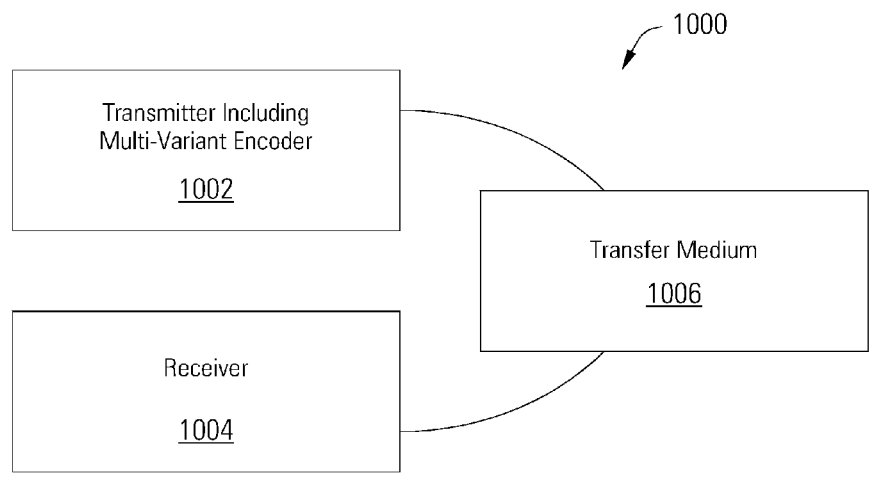
FIG. 10 depicts a wireless communication system including a data processing system with penalty based multi-variant encoding in accordance with one or more embodiments of the present invention.

Although the data processing system with penalty based multi-variant encoding disclosed herein is not limited to any particular application, several examples of applications are presented in FIGS. 9 and 10 that benefit from embodiments of the present invention. Turning to FIG. 9, a storage system 900 is illustrated as an example application of a data processing system with penalty based multi-variant encoding in accordance with some embodiments of the present invention. The storage system 900 includes a read channel circuit 902 with a data processing system with out of order transfer in accordance with some embodiments of the present inventions. Storage system 900 may be, for example, a hard disk drive. Storage system 900 also includes a preamplifier 904, an interface controller 906, a hard disk controller 910, a motor controller 912, a spindle motor 914, a disk platter 916, and a read/write head assembly 920. Interface controller 906 controls addressing and timing of data to/from disk platter 916. The data on disk platter 916 consists of groups of magnetic signals that may be detected by read/write head assembly 920 when the assembly is properly positioned over disk platter 916. In one embodiment, disk platter 916 includes magnetic signals recorded in accordance with either a longitudinal or a perpendicular recording scheme.

In a typical read operation, read/write head assembly 920 is accurately positioned by motor controller 912 over a desired data track on disk platter 916. Motor controller 912 both positions read/write head assembly 920 in relation to disk platter 916 and drives spindle motor 914 by moving read/write head assembly 920 to the proper data track on disk platter 916 under the direction of hard disk controller 910. Spindle motor 914 spins disk platter 916 at a determined spin rate (RPMs). Once read/write head assembly 920 is positioned adjacent the proper data track, magnetic signals representing data on disk platter 916 are sensed by read/write head assembly 920 as disk platter 916 is rotated by spindle motor 914. The sensed magnetic signals are provided as a continuous, minute analog signal representative of the magnetic data on disk platter 916. This minute analog signal is transferred from read/write head assembly 920 to read channel circuit 902 via preamplifier 904. Preamplifier 904 is operable to amplify the minute analog signals accessed from disk platter 916. In turn, read channel circuit 902 decodes and digitizes the received analog signal to recreate the information originally written to disk platter 916. This data is provided as read data 922 to a receiving circuit. While processing the read data, read channel circuit 902 processes the received signal using a data processing system with penalty based multi-variant encoding. Such a data processing system with penalty based multi-variant encoding may be implemented consistent with the circuits and methods disclosed in FIGS. 1-8. A write operation is substantially the opposite of the preceding read operation with write data 924 being provided to read channel circuit 902. This data is then encoded and written to disk platter 916.

It should be noted that storage system 900 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 900, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A penalty based multi-variant encoder used in relation to read channel circuit 902 may be, but is not limited to, low density parity check (LDPC) encoder circuits as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 900 may be modified to include solid state memory that is used to store data in addition to the storage offered by disk platter 916. This solid state memory may be used in parallel to disk platter 916 to provide additional storage. In such a case, the solid state memory receives and provides information directly to read channel circuit 902. Alternatively, the solid state memory may be used as a cache where it offers faster access time than that offered by disk platted 916. In such a case, the solid state memory may be disposed between interface controller 906 and read channel circuit 902 where it operates as a pass through to disk platter 916 when requested data is not available in the solid state memory or when the solid state memory does not have sufficient storage to hold a newly written data set. Based upon the disclosure provided herein, one of ordinary skill in the art will recognize a variety of storage systems including both disk platter 916 and a solid state memory.

Turning to FIG. 10, a wireless communication system 1000 or data transmission device including a transmitter 1002 with a data processing system with penalty based multi-variant encoding is shown in accordance with some embodiments of the present inventions. The transmitter 1002 is operable to transmit encoded information via a transfer medium 1006 as is known in the art. The encoded data is received from transfer medium 1006 by receiver 1004. Transmitter 1002 incorporates a data processing system with penalty based multi-variant encoding. Such a data processing system with penalty based multi-variant encoding may be implemented consistent with the circuits and methods disclosed in FIGS. 1-8.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel systems, devices, methods and arrangements for data processing with penalty based multi-variant encoding. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system comprising:
   a salting circuit operable to apply a plurality of salt data patterns to data derived from a data input;
   at least one encoding circuit operable to encode the data derived from the data input to yield a plurality of candidate codewords, wherein each of the candidate codewords is at least partially different due to the plurality of salt data patterns applied by the salting circuit; and
   a codeword selection circuit operable to select one of the plurality of candidate codewords as an output codeword based at least in part on robustness data for patterns in the plurality of candidate codewords.

2. The data processing system of claim 1, wherein each of the plurality of candidate codewords is a valid encoded version of the data derived from the data input and wherein each of the plurality of candidate codewords is capable of being decoded with a same decoding algorithm to yield a duplicate of the data derived from the data input.

3. The data processing system of claim 1, wherein the at least one encoding circuit comprises a plurality of low density parity check decoders.

4. The data processing system of claim 1, further comprising a modulation encoder operable to apply pattern constraints to the data input, and wherein the data derived from the data input comprises modulation encoded data from the modulation encoder, wherein the salting circuit is operable to apply the plurality of salt data patterns to the modulation encoded data after the pattern constraints are applied and before the at least one encoding circuit encodes the modulation encoded data.

5. The data processing system of claim 4, wherein the codeword selection circuit is operable to select said one of the plurality of candidate codewords by evaluating a parity bit portion of the plurality of candidate codewords generated by the at least one encoding circuit.

6. The data processing system of claim 1, wherein the salting circuit is operable to apply the plurality of salt data patterns to the data input, wherein the data derived from the data input comprises a plurality of salted data values from the salting circuit, further comprising a plurality of modulation encoders operable to apply pattern constraints to each of the plurality of salted data values to yield a plurality of modulation encoded data values, wherein the at least one encoding circuit is operable to encode the plurality of modulation encoded data values to yield the plurality of candidate codewords.

7. The data processing system of claim 6, wherein the codeword selection circuit is operable to select said one of the plurality of candidate codewords by evaluating an entirety of each of the plurality of candidate codewords generated by the at least one encoding circuit.

8. The data processing system of claim 1, further comprising at least one mask expansion circuit, wherein the salting circuit is operable to apply the plurality of salt data patterns to an output of the at least one encoding circuit by mask expansion.

9. The data processing system of claim 1, wherein the codeword selection circuit comprises a lookup table storing the robustness data for the patterns in the plurality of candidate codewords.

10. The data processing system of claim 1, wherein the codeword selection circuit comprises a sliding window to identify each data triple in the plurality of candidate codewords and an accumulator to total a penalty value for each identified data triple.

11. The data processing system of claim 1, wherein the robustness data comprises an error rate for a middle data symbol in each possible triple of data symbols to be processed by the data processing system.

12. The data processing system of claim 11, wherein the robustness data is generated by passing test data through a test data processing system with similar operating characteristics to the data processing system and counting the error rate for each of the middle data symbols in each possible triple of data symbols.

13. The data processing system of claim 1, further comprising:
    a data detector circuit operable to apply a data detection algorithm to a signal derived from the output codeword to yield a detected output; and
    a data decoder circuit operable to apply a data decoding algorithm to a decoder input derived from the detected output to produce a copy of the data derived from the data input and the salt data pattern applied to the generate the output codeword, wherein the data decoder circuit is further operable to discard the salt data pattern and to yield the copy of the data derived from the data input as a data output.

14. The data processing system of claim 1, wherein the system is implemented as an integrated circuit.

15. The data processing system of claim 1, wherein the data processing system is implemented as part of a device selected from a group consisting of: a data storage device, and a data communication device.

16. A method for data processing, comprising:
    adding a plurality of salt data patterns to a data input to yield a plurality of salted data patterns;
    applying a low density parity check encoding algorithm to the plurality of salted data patterns to yield a plurality of codeword candidates, wherein each of the plurality of codeword candidates is a valid encoded version of the data input and wherein each of the plurality of codeword candidates can be decoded with a same decoding algorithm;
    evaluating the plurality of codeword candidates based on robustness data for possible patterns in the plurality of codeword candidates; and selecting a codeword to output from among the plurality of codeword candidates based at least in part on the robustness data.

17. The method of claim 16, further comprising generating the robustness data by passing test data through a data processing system and counting errors for a middle symbol in each possible symbol triplet as it is processed by the data processing system.

18. The method of claim 16, wherein evaluating the plurality of codeword candidates comprises calculating a total penalty value based on an error rate of each middle symbol in each symbol triplet in the plurality of codeword candidates.

19. The method of claim 16, further comprising modulation encoding the data input before applying the low density parity check encoding algorithm.

20. A storage system, comprising:
  a multi-variant encoder operable to encode a data input, comprising:
    a salting circuit operable to apply a plurality of salt data patterns to data derived from a data input;
    at least one encoding circuit operable to encode the data derived from the data input to yield a plurality of candidate codewords, wherein each of the candidate codewords is at least partially different due to the plurality of salt data patterns applied by the salting circuit; and
    a codeword selection circuit operable to select one of the plurality of candidate codewords as an output codeword based at least in part on robustness data for patterns in the plurality of candidate codewords;
  a storage medium maintaining a data set comprising output codewords processed by the multi-variant encoder;
  a read/write head assembly operable to write the data set to the storage medium and to read the data set from the storage medium; and
  a decoder operable to decode the data set after it is read from the storage medium and to produce a copy of the data input and the salt data pattern applied to generate the output codeword, wherein the decoder is further operable to discard the salt data pattern and to yield the copy of the data input as a data output.

* * * * *